United States Patent [19]
Sands et al.

[11] Patent Number: 5,691,504
[45] Date of Patent: Nov. 25, 1997

[54] MULTILAYER COMPUTER CHASSIS HAVING INTEGRAL CIRCUIT BOARD MOUNTING AND GROUNDING STRUCTURE

[75] Inventors: Steven L. Sands; George Thomas Holt, both of Austin, Tex.

[73] Assignee: Dell USA, L.P., Round Rock, Tex.

[21] Appl. No.: 435,921

[22] Filed: May 5, 1995

[51] Int. Cl.$^6$ ...................................................... H05K 5/00
[52] U.S. Cl. .................. 174/35 R; 174/51; 174/52.1; 361/752; 361/753; 361/756; 361/683; 361/796; 361/799; 361/801; 361/758; 361/818; 361/802; 29/831
[58] Field of Search ...................... 174/35 R, 356 C, 174/51, 52.1; 361/816, 818, 752, 753, 796, 799, 800, 801, 807, 809, 810, 683, 756, 758, 802; 29/831

[56] References Cited

U.S. PATENT DOCUMENTS

| | | | |
|---|---|---|---|
| 4,649,461 | 3/1987 | Matsuta | 361/415 |
| 4,823,235 | 4/1989 | Suzuki et al. | 361/424 |
| 5,392,192 | 2/1995 | Dunn et al. | 361/683 |
| 5,398,156 | 3/1995 | Steffes et al. | 361/683 |
| 5,548,483 | 8/1996 | Feldman | 361/737 |

FOREIGN PATENT DOCUMENTS 405335773  12/1993  Japan ..................................... 361/818

*Primary Examiner*—Kristine L. Kincaid
*Assistant Examiner*—Kristina Soderquist
*Attorney, Agent, or Firm*—Skjerven, Morrill, MacPherson, Franklin & Friel L.L.P.; Stephen A. Terrile

[57] ABSTRACT

A chassis for containing a circuit board and a method of mounting a circuit board to a chassis. The chassis includes: (1) an outer chassis portion having a conductive material and having a plurality of associated pairs of integral circuit board mounts and outer chassis apertures formed in a substantially planar wall thereof, the circuit board mounts protruding toward an interior of the outer chassis portion and (2) an inner chassis portion having a plurality of associated pairs of integral spring members and inner chassis apertures formed in a substantially planar wall thereof, the plurality of circuit board mounts registerable with the plurality of inner chassis apertures to allow the plurality of circuit board mounts to pass through the plurality of inner chassis apertures as the wall of the inner chassis portion is brought into proximity with the wall of the outer chassis portion, the wall of the inner chassis portion substantially occluding the outer chassis apertures and the wall of the outer chassis portion substantially occluding the inner chassis apertures to form an electromagnetic interference ("EMI") shield, the plurality of circuit board mounts and the plurality of spring members cooperable to mount a circuit board to the chassis and to provide a grounding path from the circuit board to the chassis for electrical currents associated with the circuit board.

36 Claims, 2 Drawing Sheets

MULTILAYER COMPUTER CHASSIS HAVING INTEGRAL CIRCUIT BOARD MOUNTING AND GROUNDING STRUCTURE

TECHNICAL FIELD OF THE INVENTION

The present invention is directed, in general, to computer systems and, more particularly, to a multilayer chassis for a computer system, the multiple layers of the chassis providing a mechanical mounting of a circuit board within the chassis that does not require separate fasteners and an electrical grounding for electrical currents generated by circuitry associated with the circuit board.

BACKGROUND OF THE INVENTION

A computer chassis has many functions. First, it serves as a shelter to provide mechanical containment for electronic and mechanical components of a computer, protecting them from harmful contact with external mechanical or electrical forces. Second, it serves as a mounting structure to which the components are secured in a prescribed relative position to allow convenient interconnecting of the components.

Finally, the chassis serves as a barrier for electromagnetic interference ("EMI") caused by electromagnetic fields generated within or without the chassis. As computers have grown more powerful, the electronic components thereof have become faster, increasing the potential for generation of interfering (and thus often illegal) radio frequency interference ("RFI"). Further, the electronic components have themselves become more sensitive to RFI generated externally. Therefore, good chassis design dictates that there not be open holes in the chassis of sufficient size to emanate or admit EMI. Further, the chassis should provide a grounding path for the energy contained in the EMI.

With these functions in mind, the manufacturing process for electronics chasses for computers, and for personal computers ("PCs") in particular, is at least a three-step process depending, in large part, on the final desired shape of the chassis, the manner in which the chassis is to be secured to its environment and the manner in which electronic components are to be secured within the chassis.

Manufacture of a typical chassis (generally a box-like structure) begins by stamping parts of the chassis out of sheet metal with a die press. The stamping step yields one or more flat sheets of metal having a desired geometry. The flat sheets are then bent or folded to form portions of the finished chassis. In the bending step, various edges of the flat sheet are brought into proximity with one another to form edges and corners of the chassis portions. The edges or corners may be spot welded, soldered or brazed together to create a permanent bond. Finally, screws or other removable fasteners may be used removably to join the chassis portions together to form a rigid, mechanically sturdy chassis, to form a barrier as against EMI emanating from the components in the chassis, to shield the components from stray EMI from without the chassis and to form good electrical conductivity in the chassis for grounding purposes, as described previously.

Prior art methods of securing a motherboard to the main chassis of a PC are not only labor intensive, but also result in several disadvantages realized during operation of the PC. As part of the stamping step, a plurality of hooks are formed on the floor of the chassis. These hooks are bent upward in the subsequent bending step. The hooks are arranged to provide a channel for capturing opposing sides of the motherboard, allowing the motherboard to slide only in the direction of the channel.

Since the hooks are formed by stamping and bending a portion of the floor of the chassis, each resulting hook is inevitably located adjacent a window in the chassis created by the displacement of material displaced to create the hook. These windows potentially allow EMI (including RFI) to escape from, or intrude into, the chassis.

Further, the hooks are, by themselves, inadequate to provide sufficient grounding, since the contact area between the hooks and the motherboard is relatively small and since variations in motherboard thickness often prevent an interference fit with the hooks required to form a good grounding path. Accordingly, such prior art chasses further provide a plurality of bosses that rise from the chassis floor at predetermined locations. The bosses are adapted to receive screws or bolts that pass through holes in the motherboard. Once the motherboard is slid into a desired position within the channel created by the hooks and over the bosses, significant labor is required to align the apertures of the motherboard with respect to the hooks and bosses and to drive the individual screws or bolts through each of the holes into their corresponding bosses. Further disadvantageously, the bosses are subject to being stripped during manufacture or repair when the screws or bolts are overtorqued or axially misaligned.

Unfortunately, the locations of the hooks and bosses are often chosen primarily to afford the most reliable mechanical support for the motherboard; they are rarely optimized for electrical grounding. Therefore, care must be taken in the design of the motherboard to route grounding traces to the correct locations on the motherboard, sometimes resulting in awkward motherboard layout.

Finally, should the bosses and hooks be properly located to provide adequate grounding for the motherboard, they do not form a shield as against transverse electromagnetic ("TEM") waves that emanate from the motherboard in the plane thereof.

Accordingly, what is needed in the art are a chassis and method of assembly thereof that seal windows in the chassis as against EMI leakage, eliminate much of the labor previously required to assemble such chasses and that provide good mechanical mounting, electrical grounding and EMI suppression (including TEM wave suppression) for a circuit board.

SUMMARY OF THE INVENTION

To address the above-discussed deficiencies of the prior art, it is a primary object of the present invention to provide a chassis that allows rapid and reliable mechanical mounting and electrical grounding of a circuit board and chassis. Preferably, the chassis should be easy and inexpensive to manufacture and should allow flexibility in the layout of the circuit boards it is to contain.

In the attainment of the above-described primary object, the present invention provides a chassis for containing a circuit board and a method of mounting a circuit board to a chassis. The chassis comprises: (1) an outer chassis portion composed of a conductive material and having a plurality of associated pairs of integral circuit board mounts and outer chassis apertures formed in a substantially planar wall thereof, the circuit board mounts protruding toward an interior of the outer chassis portion and (2) an inner chassis portion having a plurality of associated pairs of integral spring members and inner chassis apertures formed in a substantially planar wall thereof, the plurality of circuit board mounts registerable with the plurality of inner chassis apertures to allow the plurality of circuit board mounts to pass through the plurality of inner chassis apertures as the wall of the inner chassis portion is brought into proximity with the wall of the outer chassis portion, the wall of the inner chassis portion substantially occluding the outer chassis apertures and the wall of the outer chassis portion substantially occluding the inner chassis apertures to form an EMI shield, the plurality of circuit board mounts and the plurality of spring members cooperable to mount a circuit board to the chassis and to provide a grounding path from the circuit board to the chassis for electrical currents associated with the circuit board.

Thus, the present invention provides a novel mounting structure for a circuit board featuring cooperating mounts and spring members to hold the circuit board in place, providing both mechanical and electrical support for the board. Further, the two-layer design of the present invention provides a tighter EMI shield to attenuate electromagnetic radiation emanating from the circuit board.

In a preferred embodiment of the present invention, each of the plurality of circuit board mounts comprises a hook portion, an inner surface of the hook portion bearable against a first surface of the circuit board to retain the circuit board in proximity with the inner chassis portion.

The hook portion preferably reaches through apertures in the circuit board to bear against the circuit board's first surface. In most desktop PCs, the wall of the chassis to which the circuit board is mounted is the floor. In this environment, the first surface of the circuit board is the upper surface (or the surface opposite the wall).

In a preferred embodiment of the present invention, each of the plurality of spring members comprises a cantilevered projection, the cantilevered projection bearable against a second surface of the circuit board to urge the circuit board into contact with the plurality of circuit board mounts.

That the spring members are formed integrally with the inner chassis portion is an advantageous aspect of the present invention, since individual springs would be tedious and time consuming to assemble or repair. The spring members are therefore made in the form of elongated fingers. In a more preferred embodiment, the inner chassis portion is composed of a spring stainless steel or beryllium copper, giving the spring members great resilience.

In a preferred embodiment of the present invention, the inner chassis portion has a plurality of associated sidewalls about a perimeter thereof, the plurality of associated sidewalls in proximity with the circuit board to suppress TEM waves emanated from the circuit board.

As those of ordinary skill in the art are familiar, circuit boards containing high speed computing circuitry often emanate TEM waves. The TEM waves spread outwardly from the circuit board, roughly in the plane thereof. As previously stated, prior art hook-and-boss mounting structures are ineffective at suppressing TEM waves. The present invention preferably employs the inner chassis portion to envelope the TEM waves, attenuating their emission from the chassis.

In a preferred embodiment of the present invention, the inner chassis portion is composed of a conductive material. The inner chassis portion is preferably employed as the primary grounding path from the circuit board to the outer chassis portion.

In a preferred embodiment of the present invention, the plurality of spring members are composed of a conductive material and are bearable against conductors deposited on a second surface of the circuit board to provide the grounding path. As previously described, it is advantageous that the chassis allow flexibility in circuit board layout. Accordingly, traces may be advantageously routed on the circuit board, and the spring members placed as a function of the routing, thereby fleeing board layout designers from having to concern themselves with the way in which the circuit board is to be grounded to the chassis.

In a preferred embodiment of the present invention, the outer chassis portion comprises a circuit board guide projecting from a second wall thereof, the circuit board guide prealigning the circuit board for registration with the plurality of circuit board mounts. Although certainly not necessary, the circuit board guide contacts and guides the circuit board into alignment with the circuit board mounts, thereby removing a degree of freedom from the assembly process.

In a preferred embodiment of the present invention, the chassis further comprises an access panel removably couplable to the outer chassis portion to retain the circuit board in engagement with the plurality of circuit board mounts. In a manner to be described, the circuit board is lowered onto the circuit board mounts and shifted laterally into engagement with the mounts to fix the circuit board in place. Coupling the access panel to the outer chassis portion preferably locks the circuit board into its laterally shifted position, preventing the circuit board from shifting back inadvertently and perhaps disengaging from the circuit board mounts.

In a preferred embodiment of the present invention, locations of the plurality of associated pairs of integral circuit board mounts and spring members are predetermined to correspond to locations of grounding traces on the circuit board. Again, the present invention allows circuit board layout to determine the locations of the mechanical mounts and electrical grounds, not vice versa.

In a preferred embodiment of the present invention, the circuit board is a motherboard of a PC. Those of ordinary skill in the art will recognize, however, that the present invention finds advantageous use in any electronic apparatus requiring the mounting of a circuit board within a chassis.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the an should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as broadly defined.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
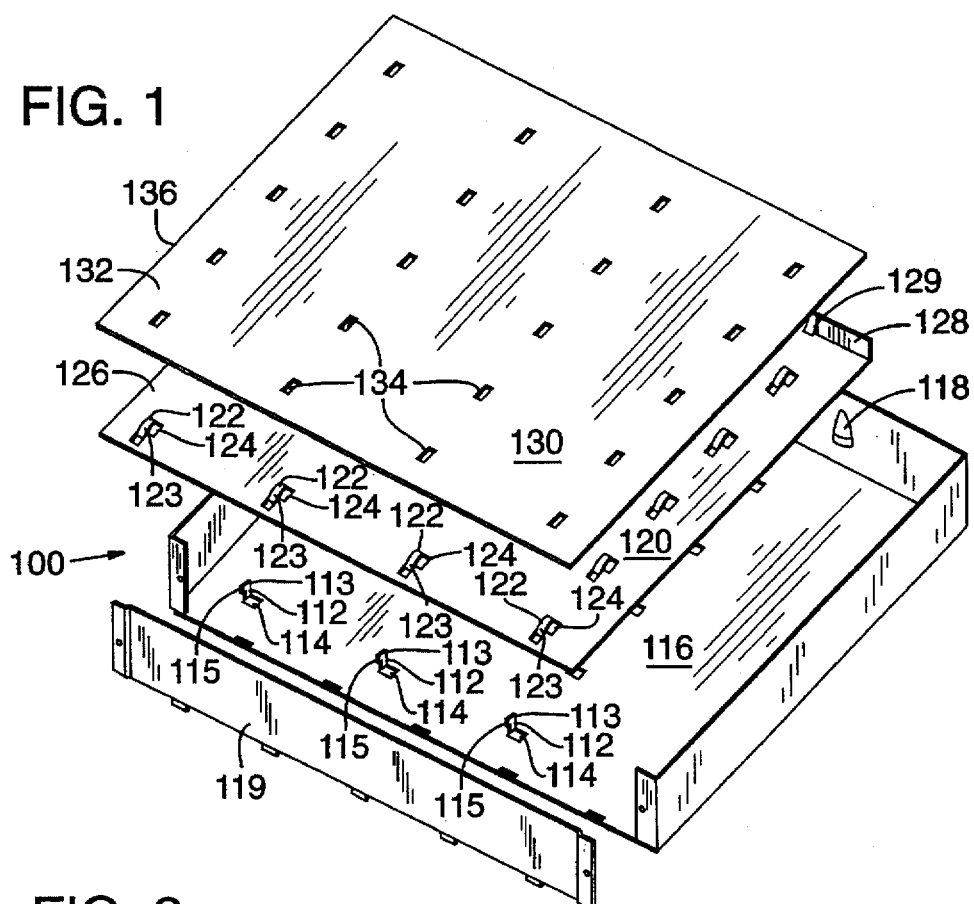
FIG. 1 illustrates an exploded isometric view of the chassis of the present invention and an associated circuit board adapted to be mounted within the chassis.

Referring initially to FIG. 1, illustrated is an exploded isometric view of the chassis of the present invention and an associated circuit board adapted to be mounted within the chassis.

The chassis, generally designated 100, comprises an outer chassis portion 110 and an inner chassis portion 120. The outer chassis portion 110 is composed of a conductive material, preferably a cold-rolled steel. The outer chassis portion 110 has a plurality of associated pairs of integral circuit board mounts 112 and outer chassis apertures 114 formed in a substantially planar wall 116 thereof, illustrated as being the floor of the outer chassis portion 110. The circuit board mounts protrude toward an interior of the outer chassis portion 110.

The inner chassis portion 120 has a plurality of associated pairs of integral spring members 122 and inner chassis apertures 124 formed in a substantially planar wall 126 thereof, again illustrated as being the floor of the inner chassis portion 120. The plurality of circuit board mounts 112 are registerable with the plurality of inner chassis apertures 124 to allow the plurality of circuit board mounts 112 to pass through the plurality of inner chassis apertures 124 as the wall 126 of the inner chassis portion 120 is brought into proximity with the wall 116 of the outer chassis portion 110.

The wall 126 of the inner chassis portion 120 substantially occludes the outer chassis apertures 114; and the wall 116 of the outer chassis portion 110 substantially occluding the inner chassis apertures 124 to form an EMI shield.

The plurality of circuit board mounts 112 and the plurality of spring members 122 cooperate to mount a circuit board 130 to the chassis 100 and to provide a grounding path from the circuit board 130 to the chassis 100 for electrical currents associated with the circuit board 130.

Each of the plurality of circuit board mounts 112 comprises a hook portion 113. An inner surface 115 of the hook portion 113 bears against a first surface 132 of the circuit board 130 to retain the circuit board 130 in proximity with the inner chassis portion 120. The hook portion 113 preferably reaches through apertures 134 in the circuit board 130 to bear against the circuit board's first surface 132.

Each of the plurality of spring members 122 comprises a cantilevered projection 123. The cantilevered projection 123 bears against a second surface 136 of the circuit board 130 to urge the circuit board 130 into contact with the plurality of circuit board mounts 112. Again, since the spring members 122 are formed integrally with the inner chassis portion 120, the complication and expense of individual springs are avoided. The spring members 122 are therefore made in the form of elongated fingers. In the illustrated embodiment, the inner chassis portion 120 is composed of a spring stainless steel or beryllium copper, giving the spring members 122 great resilience.

The inner chassis portion 120 is preferably composed of a conductive material, since the inner chassis portion 120 is preferably employed as the primary grounding path from the circuit board 130 to the outer chassis portion 110.

The inner chassis portion 120 has a plurality of associated sidewalls (only one of which is illustrated for clarity and referenced as 128) about a perimeter thereof. The plurality of associated sidewalls 128 are placed in proximity with the circuit board 130 to suppress TEM waves emanating from the circuit board 130. The sidewalls 128 make resilient contact with the circuit board 130 via one or more horizontal spring members 129. Again, as those of ordinary skill in the art are familiar, circuit boards 130 containing high speed computing circuitry often emanate TEM waves. The TEM waves spread outwardly from the circuit board 130, roughly in the plane thereof. The present invention preferably employs the associated sidewalls 128 of the inner chassis portion 120 to envelope the TEM waves, attenuating their emission from the chassis 100.

In the illustrated embodiment, the plurality of spring members 122 are composed of a conductive material and are bearable against conductors deposited on a second surface (a lower surface of the circuit board 130 and shown in FIG. 2) of the circuit board 130 to provide the grounding path. As previously described, it is advantageous that the chassis 100 allow flexibility in circuit board layout. Accordingly, traces may be advantageously routed on the circuit board 130, and the spring members 122 placed as a function of the routing, thereby freeing board layout designers from having to concern themselves with the way in which the circuit board 130 is to be grounded to the chassis 100.

In the illustrated embodiment, the outer chassis portion 110 comprises a circuit board guide 118 projecting from a second wall thereof. The circuit board guide 118 prealigns the circuit board 130 for registration with the plurality of circuit board mounts 112. Although certainly not necessary, the circuit board guide 118 contacts and guides the circuit board 130 into alignment with the circuit board mounts 112, thereby removing a degree of freedom from the assembly process.

The chassis 100 preferably further comprises an access panel 119 removably couplable to the outer chassis portion 110 to retain the circuit board 130 in engagement with the plurality of circuit board mounts 112. To assemble the chassis 100, the inner chassis portion 120 is aligned with the outer chassis portion 110 and mated thereto, the circuit board mounts 112 passing through the inner chassis apertures 124. Next, the circuit board 130 is registered with the circuit board mounts 112, lowered into place and shifted horizontally and rearwardly, as shown, thereby causing the circuit board 130 to be held between the inner surface 115 and the spring member 122. To ensure that the circuit board 130 does not shift into disengagement, the access panel 119 is fastened into place with a couple of screws or bolts in a conventional manner. Coupling the access panel 119 to the outer chassis portion 110 preferably locks the circuit board 130 into its laterally shifted position, preventing the circuit board 130 from shifting back inadvertently and perhaps disengaging from the circuit board mounts 112. Therefore, it is apparent that the present invention allows the circuit board 130 to be mounted in place with only a couple of fasteners, rather than with a fastener for each of a number of bosses.

Figure 2:
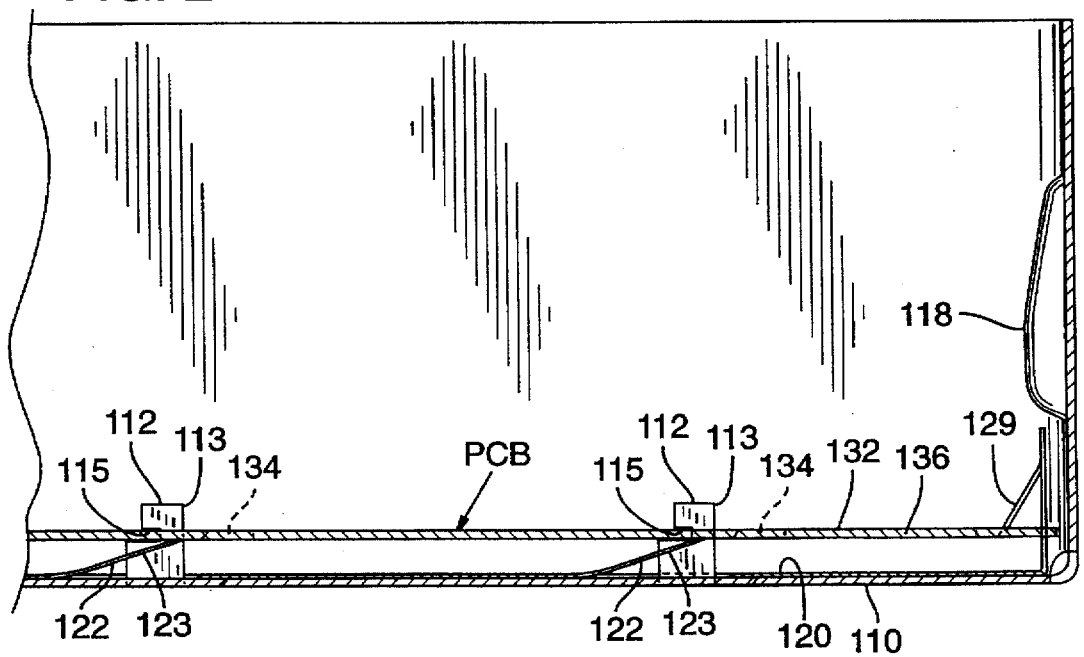
FIG. 2 illustrates an elevational view of the chassis and circuit board of FIG. 1.

Turning now to FIG. 2, illustrated is an elevational view of the chassis 100 and circuit board 130 of FIG. 1. FIG. 2 is presented primarily for the purpose of illustrating the inner chassis portion 120 and the circuit board 130 in their installed positions. The spring members 122 urge against the second surface 136 to provide a path for electrical currents from the circuit board 130 to the chassis 100. The spring members 122 further urge the circuit board 130 against the inner surface 115 of the circuit board mounts 112 to hold the circuit board 130 in place mechanically.

Figure 3:
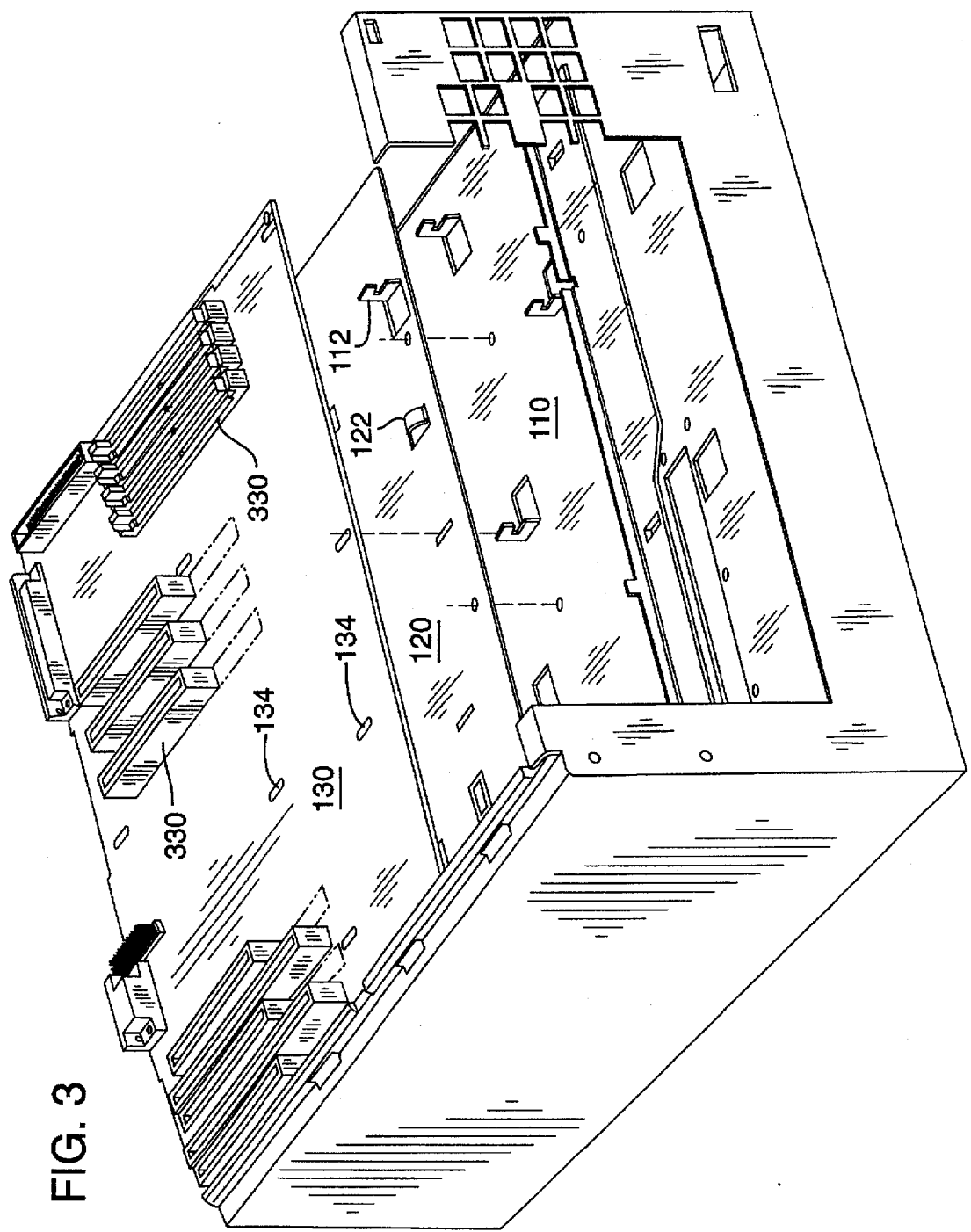
FIG. 3 illustrates an exploded isometric view of the chassis of the present invention wherein the circuit board mounts and spring members are located as a function of circuit board layout.

Turning now to FIG. 3, illustrated is an exploded isometric view of the chassis 100 of the present invention wherein the circuit board mounts 112 and spring members 122 are located as a function of circuit board layout.

In this alternative embodiment, locations of the plurality of associated pairs of integral circuit board mounts 112 and spring members 122 are predetermined to correspond to locations of grounding traces on the circuit board 130. Again, the present invention allows circuit board 130 layout to determine the locations of the mechanical mounts and electrical grounds, not vice versa.

FIG. 3 is presented primarily for the purpose of illustrating that the circuit board mounts 112 and spring members 122 need not be arranged in a precise two-dimensional orthogonal array, as shown most clearly in FIG. 1. In fact, the circuit board mounts 112 may be located at any point on the wall 116 of the outer chassis portion 110 and there may be as few or many mounts 112 as desired. Further, the spring members 122 may be located at any point on the wall 126 of the inner chassis portion 120 and there may be as few or many members 122 as desired.

Finally, there does not need to be a one-to-one-correspondence between circuit board mounts 112 or spring members 122. As FIG. 3 clearly shows, certain of the circuit board mounts 112 lack corresponding spring members 122 and, although not shown, certain of the spring members 122 may lack corresponding circuit board mounts 112.

In the illustrated embodiment, the circuit board 130 is a motherboard of a PC. As such, the circuit board 130 may contain electrical connectors 330 allowing the circuit board 130 to be electrically coupled to, and mechanically support, daughterboards (not shown) that may contain computer memory or other peripheral circuitry. Firm mechanical support of the daughterboards is further reason for the dependable mechanical mounting the present invention affords.

Despite having illustrated the present invention in the environment of a computer chassis 100 with a circuit board 130 therein, those of ordinary skill in the art will recognize, however, that the present invention finds advantageous use in any electronic apparatus requiring the mounting of a circuit board 130 within a chassis 100, such as in audio or communications equipment.

From the above description, it is apparent that the present invention provides a chassis for containing a circuit board and a method of mounting a circuit board to a chassis. The chassis comprises: (1) an outer chassis portion composed of a conductive material and having a plurality of associated pairs of integral circuit board mounts and outer chassis apertures formed in a substantially planar wall thereof, the circuit board mounts protruding toward an interior of the outer chassis portion and (2) an inner chassis portion ha%rig a plurality of associated pairs of integral spring members and inner chassis apertures formed in a substantially planar wall thereof, the plurality of circuit board mounts registerable with the plurality of inner chassis apertures to low the plurality of circuit board mounts to pass through the plurality of inner chassis apertures as the wall of the inner chassis portion is brought into proximity with the wall of the outer chassis portion, the wall of the inner chassis portion substantially occluding the outer chassis apertures and the wall of the outer chassis portion substantially occluding the inner chassis apertures to form an EMI shield, the plurality of circuit board mounts and the plurality of spring members cooperable to mount a circuit board to the chassis and to provide a grounding path from the circuit board to the chassis for electrical currents associated with the circuit board.

Although the present invention and its advantages have been described in detail, it should be understood that various changes, substitutions and alterations can be made herein without departing from the spirit and scope of the invention as broadly defined.

What is claimed is:

1. A chassis assembly comprising:

a circuit board;

an outer chassis portion composed of a conductive material and having a plurality of associated pairs of integral circuit board mounts and outer chassis apertures formed in a substantially planar wall thereof, said circuit board mounts protruding toward an interior of said outer chassis portion; and an inner chassis portion having a plurality of associated pairs of integral spring members and inner chassis apertures formed in a substantially planar wall thereof, said plurality of circuit board mounts registerable with said plurality of inner chassis apertures to allow said plurality of circuit board mounts to pass through said plurality of inner chassis apertures as said wall of said inner chassis portion is brought into proximity with said wall of said outer chassis portion, said wall of said inner chassis portion substantially occluding said outer chassis apertures and said wall of said outer chassis portion substantially occluding said inner chassis apertures to form an electromagnetic interference (EMI) shield, said plurality of circuit board mounts and said plurality of spring members cooperable to mount said circuit board to said chassis and to provide a grounding path from said circuit board to said chassis for electrical currents associated with said circuit boar wherein each of said plurality of circuit board mounts comprises a hook portion, an inner surface of said hook portion bearable against a first surface of said circuit board to retain said circuit board in proximity with said inner chassis portion.

2. The chassis assembly as recited in claim 1 wherein each of said plurality of spring members comprises a cantilevered projection, said cantilevered projection bearable against a second surface of said circuit board to urge said circuit board into contact with said plurality of circuit board mounts.

3. The chassis assembly as recited in claim 1 wherein said inner chassis portion has a plurality of associated sidewalls about the perimeter thereof, said plurality of associated sidewalls in proximity with said circuit board to suppress transverse electromagnetic (TEM) waves emanated from said circuit board.

4. The chassis assembly as recited in claim 1 wherein said inner chassis portion is composed of a conductive material.

5. The chassis assembly as recited in claim 1 wherein said plurality of spring members are composed of a conductive material and are bearable against conductors deposited on a second surface of said circuit board to provide said grounding path.

6. The chassis assembly as recited in claim 1 wherein said outer chassis portion comprises a circuit board guide projecting from a second wall thereof, said circuit board guide prealigning said circuit board for registration with said plurality of circuit board mounts.

7. The chassis assembly as recited in claim 1 further comprising an access panel removably couplable to said outer chassis portion to retain said circuit board in engagement with said plurality of circuit board mounts.

8. The chassis assembly as recited in claim 1 wherein locations of said plurality of associated pairs of integral circuit board mounts and spring members are predetermined to correspond to locations of grounding traces on said circuit board.

9. The chassis assembly as recited in claim 1 wherein said circuit board is a motherboard of a personal computer (PC).

10. A method of mounting a circuit board to a chassis, comprising the steps of:

bringing an outer chassis portion into proximity with an inner chassis portion, said outer chassis portion composed of a conductive material and having a plurality of associated pairs of integral circuit board mounts and outer chassis apertures formed in a substantially planar wall thereof, said circuit board mounts protruding toward an interior of said outer chassis portion, said inner chassis portion having a plurality of associated pairs of integral spring members and inner chassis apertures formed in a substantially planar wall thereof, said plurality of circuit board mounts registerable with said plurality of inner chassis apertures to allow said plurality of circuit board mounts to pass through said plurality of inner chassis apertures as said wall of said inner chassis portion is brought into proximity with said wall of said outer chassis portion, said wall of said inner chassis portion substantially occluding said outer chassis apertures and said wall of said outer chassis portion substantially occluding said inner chassis apertures to form an electromagnetic interference (EMI) shield; and coupling a circuit board to said plurality of circuit board mounts and said plurality of spring members, said circuit board thereby removably mounted to said chassis, said plurality of circuit board mounts and said plurality of spring members providing a grounding path from said circuit board to said chassis for electrical currents associated with said circuit board;

wherein each of said plurality of circuit board mounts comprises a hook portion, the method further comprising the step of bearing against a first surface of said circuit board with an inner surface of said hook portion to retain said circuit board in proximity with said inner chassis portion.

11. The method as recited in claim 10 wherein each of said plurality of spring members comprises a cantilevered projection, the method further comprising the step of bearing against a second surface of said circuit board with said cantilevered projection to urge said circuit board into contact with said plurality of circuit board mounts.

12. The method as recited in claim 10 wherein said inner chassis portion has a plurality of associated sidewalls about the perimeter thereof, the method further comprising the step of bringing said plurality of associated sidewalls into proximity with said circuit board to suppress transverse electromagnetic (TEM) waves emanated from said circuit board.

13. The method as recited in claim 10 wherein said inner chassis portion is composed of a conductive material.

14. The method as recited in claim 10 wherein said plurality of spring members are composed of a conductive material, the method further comprising the step of bearing said spring members against conductors deposited on a second surface of said circuit board to provide said grounding path.

15. The method as recited in claim 10 wherein said outer chassis portion comprises a circuit board guide projecting from a second wall thereof, the method further comprising the step of prealigning said circuit board for registration with said plurality of circuit board mounts with said circuit board guide.

16. The method as recited in claim 10 further comprising the step of coupling an access panel to said outer chassis portion to retain said circuit board in engagement with said plurality of circuit board mounts.

17. The method as recited in claim 10 wherein locations of said plurality of associated pairs of integral circuit board mounts and spring members are predetermined to correspond to locations of grounding traces on said circuit board.

18. The method as recited in claim 10 wherein said circuit board is a motherboard of a personal computer (PC).

19. A chassis assembly comprising:

a circuit board;

an outer chassis portion composed of a conductive material and having a plurality of integral circuit board mounts formed in a substantially planar wall thereof, said circuit board mounts protruding toward an interior of said outer chassis portion; and an inner chassis portion having a plurality of integral spring members formed in a substantially planar wall thereof, said plurality of circuit board mounts registerable with a plurality of inner chassis apertures in said inner chassis portion to allow said plurality of circuit board mounts to pass through said plurality of inner chassis apertures as said wall of said inner chassis portion is brought into proximity with said wall of said outer chassis portion, said plurality of circuit board mounts and said plurality of spring members cooperable to pass through corresponding apertures in said circuit board, said plurality of circuit board mounts and spring members providing opposing forces to mount said circuit board to said chassis and to provide a grounding path, from said circuit board to said chassis via said plurality of spring members, for electrical currents associated with said circuit board;

wherein each of said plurality of circuit board mounts comprises a hook portion, an inner surface of said hook portion bearable against a first surface of said circuit board to retain said circuit board in proximity with said inner chassis portion.

20. The chassis assembly as recited in claim 19 wherein each of said plurality of spring members comprises a cantilevered projection, said cantilevered projection bearable against a second surface of said circuit board to urge said circuit board into contact with said plurality of circuit board mounts.

21. The chassis assembly as recited in claim 19 wherein said inner chassis portion has a plurality of associated sidewalls about the perimeter thereof, said plurality of associated sidewalls in proximity with said circuit board to suppress transverse electromagnetic (TEM) waves emanated from said circuit board.

22. The chassis assembly as recited in claim 19 wherein said inner chassis portion is composed of a conductive material.

23. The chassis assembly as recited in claim 19 wherein said plurality of spring members are bearable against conductors deposited on a second surface of said circuit board to provide said grounding path.

24. The chassis assembly as recited in claim 19 wherein said outer chassis portion comprises a circuit board guide projecting from a second wall thereof, said circuit board guide prealigning said circuit board for registration with said plurality of circuit board mounts.

25. The chassis assembly as recited in claim 19 further comprising an access panel removably couplable to said outer chassis portion to retain said circuit board in engagement with said plurality of circuit board mounts.

26. The chassis assembly as recited in claim 19 wherein locations of said plurality of associated pairs of integral circuit board mounts and spring members are predetermined to correspond to locations of grounding traces on said circuit board.

27. The chassis assembly as recited in claim 19 wherein said circuit board is a motherboard of a personal computer (PC).

28. A method of mounting a circuit board to a chassis, comprising the steps of:

bringing an outer chassis portion into proximity with an inner chassis portion, said outer chassis portion composed of a conductive material and having a plurality of integral circuit board mounts and outer chassis apertures formed in a substantially planar wall thereof, said circuit board mounts protruding toward an interior of said outer chassis portion, said inner chassis portion having a plurality of integral spring members formed in a substantially planar wall thereof, said plurality of circuit board mounts registerable with a plurality of inner chassis apertures in said inner chassis portion to allow said plurality of circuit board mounts to pass through said plurality of inner chassis apertures as said wall of said inner chassis portion is brought into proximity with said wall of said outer chassis portion; and coupling a circuit board to said plurality of circuit board mounts and said plurality of spring members, said circuit board thereby removably mounted to said chassis, said plurality of circuit board mounts and said plurality of spring members cooperable to pass through corresponding apertures in said circuit board, said plurality of circuit board mounts and spring members providing opposing forces to mount said circuit board to said chassis and to provide a grounding path, from said circuit board to said chassis via said plurality of spring members, for electrical currents associated with said circuit board;

wherein each of said plurality of circuit board mounts comprises a hook portion, the method further comprising the step of bearing against a first surface of said circuit board with an inner surface of said hook portion to retain said circuit board in proximity with said inner chassis portion.

29. The method as recited in claim 28 wherein each of said plurality of spring members comprises a cantilevered projection, the method further comprising the step of bearing against a second surface of said circuit board with said cantilevered projection to urge said circuit board into contact with said plurality of circuit board mounts.

30. The method as recited in claim 28 wherein said inner chassis portion has a plurality of associated sidewalls about the perimeter thereof, the method further comprising the step of bringing said plurality of associated sidewalls into proximity with said circuit board to suppress transverse electromagnetic (TEM) waves emanated from said circuit board.

31. The method as recited in claim 28 wherein said inner chassis portion is composed of a conductive material.

32. The method as recited in claim 28 further comprising the step of bearing said spring members against conductors deposited on a second surface of said circuit board to provide said grounding path.

33. The method as recited in claim 28 wherein said outer chassis portion comprises a circuit board guide projecting from a second wall thereof, the method further comprising the step of prealigning said circuit board for registration with said plurality of circuit board mounts with said circuit board guide.

34. The method as recited in claim 28 further comprising the step of coupling an access panel to said outer chassis portion to retain said circuit board in engagement with said plurality of circuit board mounts.

35. The method as recited in claim 28 wherein locations of said plurality of associated pairs of integral circuit board mounts and spring members are predetermined to correspond to locations of grounding traces on said circuit board.

36. The method as recited in claim 28 wherein said circuit board is a motherboard of a personal computer (PC).

* * * * *

UNITED STATES PATENT AND TRADEMARK OFFICE
CERTIFICATE OF CORRECTION

PATENT NO. : 5,691,504
DATED : November 25, 1997
INVENTOR(S) : Sands et al.

It is certified that error appears in the above-identified patent and that said Letters Patent is hereby corrected as shown below:

Col. 1, line 35    delete "chasses" and insert --chassis--

Col. 2, line 40    delete "chasses" and insert --chassis--

Signed and Sealed this

Twenty-eighth Day of July, 1998

Attest:

BRUCE LEHMAN

*Attesting Officer*    *Commissioner of Patents and Trademarks*